United States Patent [19]
Koehler

[11] Patent Number: 5,371,698
[45] Date of Patent: Dec. 6, 1994

[54] RANDOM ACCESS OPTICAL MEMORY

[76] Inventor: Dale R. Koehler, 1332 Wagontrain Dr., Albuquerque, N. Mex. 87123

[21] Appl. No.: 882,564

[22] Filed: May 13, 1992

[51] Int. Cl.⁵ .............................................. G11C 11/34
[52] U.S. Cl. .................................... 365/114; 365/112; 365/119; 365/215; 365/234
[58] Field of Search ............... 365/112, 114, 119, 215, 365/234, 115

[56] References Cited

U.S. PATENT DOCUMENTS

| | | | |
|---|---|---|---|
| 3,518,634 | 6/1970 | Ballman et al. | 365/114 |
| 4,052,706 | 10/1977 | Spritz et al. | 365/112 |
| 4,575,820 | 11/1986 | Barditch | 365/114 |
| 4,790,634 | 12/1988 | Miller et al. | 359/71 |

Primary Examiner—Eugene R. LaRoche
Assistant Examiner—Huan Hoang

[57] ABSTRACT

The multi-dimensional optical memory utilizes the wavelength and intensity dimensions to effect a high density record. With incorporation of a broadband light source, scanning monochromator and photo detector array, a high speed random access optical memory system is realized. The system is executed in terms of a silicon based manufacturing technology allowing advantages of low cost and small physical size resulting from photolithographic batch-processing producibility.

17 Claims, 7 Drawing Sheets

RANDOM ACCESS OPTICAL MEMORY

BACKGROUND OF THE INVENTION

The present invention relates to electrically addressable light detector arrays acting in cooperation with planar light modification arrays to effect random access optical memory systems. The most common technology employed for optical memory systems is the read only optical disk. Video, audio or other information is written or encoded onto the disk in the form of localized variations in the surface topography or optical characteristics. Pulsed high power laser bursts are usually used to cause intense surface heating on the disks thereby melting, ablating or otherwise altering the disks in the form of micron sized spots. The difference between the transmissive and reflective optical characteristics of the spots relative to the unaffected surface constitutes a bit of digital information. Two concepts representative of such optical-characteristic modification techniques are described in U.S. Pat. No. 4,876,666 to H. Imai, K. Okada, and M. Tadokoro and U.S. Pat. No. 4,896,314 to W. Skiens, M. Lind, J. Hartman, J. Swanson and N. Iwamoto. The information is organized into a helical or spiral pattern and subdivided into sectors. By directing a light beam, usually a low power laser, onto the optical disk and observing the reflected or transmitted beam while rotating the disk and while radially positioning the light source, the total surface of the disk can be examined or interrogated. Examples of this reading technology are presented in U.S. Pat. No. 4,868,804 to F. LeCarvennec, D. Lecomte, D. Leterme and P. Romeas and U.S. Pat. No. 4,912,697 to M. Enari and other coinventors. Because of the small spot size, limited typically by the focusing properties of the recording laser beam, optical memories or recordings constitute the highest bit density technology available. This technology, however, is presently limited in its reading speed which is determined by the rotational velocity of the disk and the mechanical radial positioning speed of the reading laser source. Because of the relatively large inertial masses of the rotating disk and the moving laser head, positioning, or access, times are in the millisecond range. Bit data can be read out in a serial fashion, however, at megahertz rates.

Recently, additional storage dimensionality has been disclosed in the wavelength information concepts in U.S. Pat. No. 3,896,420 to A. Szabo and U.S. Pat. No. 4,101,976 to G. Castro, D. Haarer, R. MacFarlane and H. Trommsdorff. These techniques, characterized as frequency selective storage memories, operate by providing selectable narrowband light absorption in elemental regions of a two-dimensional material as determined by a focussed laser spot. The term hole-burning is used to describe the frequency selection process and requires a laser tunable on the frequency scale. Because the phenomenon is short-lived the system requires constant regeneration and operation at cryogenic temperatures. Furthermore the regeneration process requires high laser power levels while the reading process uses low laser power levels therefore necessitating two lasers. The rather demanding technological requirements for this optical memory system seem to preclude its implementation except for the most sophisticated applications.

Another three-dimensional random access optical memory system has been disclosed by L. Cooper, L. Ii and D. Shang in U.S. Pat. No. 3,868,652. This concept is ferroelectric based and uses refractive index tailoring by electric field means to achieve information storage. The individual ferroelectric memory sites are served by conductor lines and a photoconductive layer to provide localized field generation thereby modifying the local index of refraction of the addressed memory cell. Addressing requires both electrical and optical selection. Optical irradiation is accomplished in polarized narrow-beam fashion with a planar x-y position addressable matrix array of ferroelectric shutters. Fabrication complexity deriving from multi-layer ferroelectric construction and associated requisite electrical addressing lines seems to have precluded competitive manufacturing viability of this system.

SUMMARY OF THE INVENTION

It is a purpose of the present invention to provide a high speed, high resolution, random access optical memory system. The random access optical memory is constructed of an electrically addressable photo detector array and a substrate plate patterned with an array of light modifying apertures; the photo detector array can be a conventional photo diode or photo transistor structure fabricated separately or integrally included with the aperture substrate. Advantages of low cost and small physical size result from photolithographic batch-processing manufacturability. It is also a purpose of the invention to provide multi-dimensional optical memory systems through incorporation of control of the intensity and color dimensions to achieve facilitation of addressing and expanded information dimensionality.

DESCRIPTION OF THE ILLUSTRATED EMBODIMENTS

Figure 1:
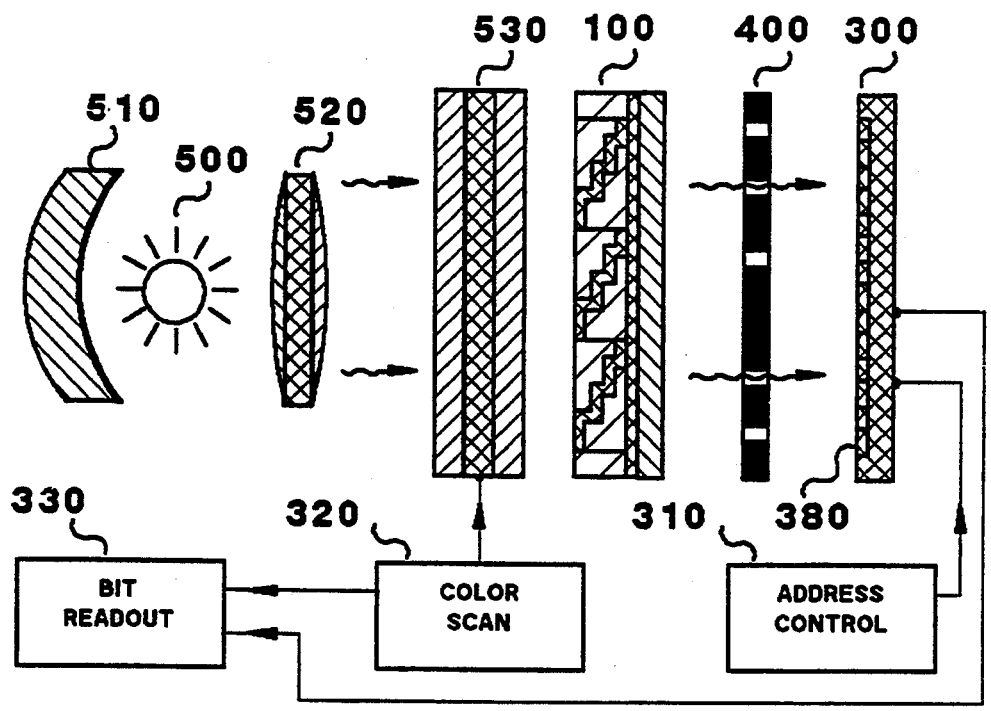
FIG. 1 is a schematic view showing a color- and intensity-state random access optical memory according to the present invention.

The preferred embodiment shown in FIG. 1 illustrates a color- and intensity-state optical memory system. Information storage on the color or wavelength dimension is constituted by assignment of numbers to colors and association of a given color with a specific memory element. The range of colors, or color-states, available determines the maximum value of the number and therefore the capacity on the wavelength scale. In a binary representation the capacity is given by N=logarithm(base 2)M where N is the number of binary bits and M is the capacity or maximum number of colors available. For example a sixteen color system is equivalent to four binary bits. In exactly analogous fashion a light-intensity scale can also constitute an information storage dimension. Storage systems utilizing such scales, of course, require reading techniques which can ascertain the specific value of the information measurand; the specific color, or color-state, in the case of the wavelength scale and the specific intensity, or intensity-state, in the case of the light-intensity scale.

Figure 2:
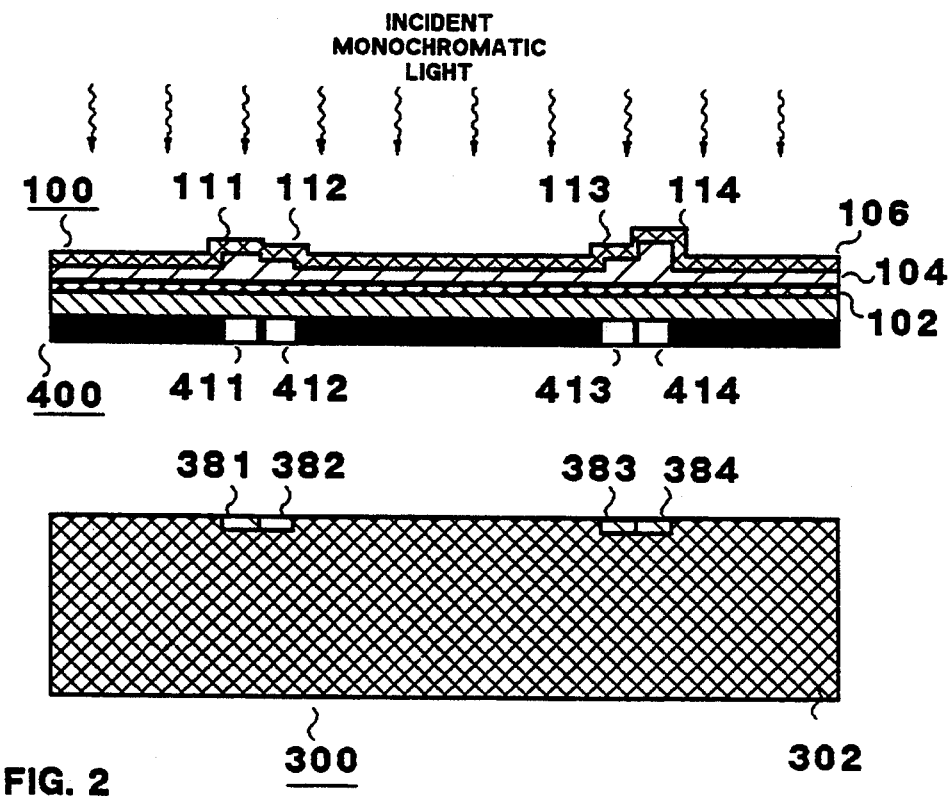
FIG. 2 is an enlarged schematic partial sectional view of the random access optical memory of FIG. 1.

The random-access optical digital memory system in FIG. 1 includes a light source means 500, 510 and 520, an optical digital record consisting of color-state memory element array 100 and intensity-state memory element array 400, and a light measuring means consisting of a scanning monochromator 530 and a third array of photo detector elements 300. These arrays are physically positioned in matched fashion or co-located so that the resultant light transmission through the color-state array 100 and the intensity-state array 400 will intercept the appropriate co-located matching elements of the photo detector array 300. As shown in FIG. 2, for each element of the planar color-state memory array 111-114, there is a corresponding individually addressable photo detector element 381-384 fabricated in substrate 302. Similarly, the intensity-state memory array 400, depicted in integral form with array 100, consists of elements 411-414 physically arrayed in matched fashion to the co-located elements 111-114 and 381-384. The information content of a color-state memory element is determined by the wavelength, or color, of light which can be transmitted through the element. The color-state memory array 100 is illustrated in FIG. 2 as a Fabry-Perot etalon array. Construction consists of top and bottom mirrors 106 and 102 separated by transmission layer 104. The optical thickness of layer 104 restricts the transmission through the etalon to only those wavelengths which are equal to integral multiples of twice the optical thickness. Color-grading or color-state assignment at the individual memory sites is accomplished by thickness fixation thereby fixing the etalon filter's color transmission function; the color-state or color-grade at the memory site is equivalent to the transmission color of the filter at the memory site. For a Fabry-Perot etalon filter with mirror reflectances of 0.98, 32 color states can be achieved in a 250 angstrom bandwidth. Alternatively, an array of color-graded dye-filters, wherein the color-transmission function of the individual dye-filter elements is utilized, can provide the color-state information function of color-state memory array 100. Dye filters are absorptive type filters in which the filter element absorbs light in certain regions of the electromagnetic spectrum and passes light in other regions thereby achieving a filtering function. Selection of dye-filters with different color transmissions, or different dyes, constitutes color-grading and thereby is an alternative to the color-graded etalon-filter construction of array 100. The information content of a light-intensity memory element is determined by the amount or intensity of light which can be transmitted through the element. The light intensity transmitted through apertured array elements is proportional to the area or physical size of the element apertures, or, in the case of light absorptive layers, the transmitted light intensity is inversely proportional to the thickness of the element layer, or inversely proportional to the density of the element layer. The intensity-state memory array 400 can be fabricated as an array of apertures, which are areally graded, that is, sized as to two-dimensional extent, each grade constituting an intensity-state, or as an array of light-absorptive layers which are thickness graded, that is, sized as to layer thickness, each grade constituting an intensity-state, or as an array of light absorptive layers which are density graded, that is, sized as to layer density, each grade constituting an intensity-state.

As depicted here, the two-dimensional array of color-state filters and the two-dimensional array of intensity-state apertures constitute a multi-dimensional, in the general case a four, dimensional optical digital record. In the degenerate case of a single-color filter, the record reduces to a three-dimensional record constituted by two physical dimensions mid an intensity dimension; the color dimension contains no information and has been reduced to a single-state means. Similarly, in the degenerate case of a single-areally-sized aperture, the record reduces to a three-dimensional record constituted by two physical dimensions and a color dimension; the intensity dimension contains no information and has been reduced to a single-state means. For the case of both a single-color filter (single-color-state means) a and a single-a-areally-sized aperture (single-intensity-state means), a two-dimensional record ensues with only two physical dimensions constituting the memory array.

In FIG. 1, the light from an incandescent or other broadband spectrum source 500, such as a multiplicity of light emitting diodes, or laser diodes, with various spectral outputs, is intensified by an optical system, consisting of reflecting mirror 510 and concentrating lens 520, onto the input face of a filter, Fabry-Perot interferometer or monochromator 530. The transmitted and filtered light from the monochromator 530 is passed through the color-state array 100 and onto the intensity-state array 400. Emergent from array 400 is a modified monochromatic light beam consisting of a pattern of intensity-modified light segments, each segment positioned in the array at the point of color conjunction of the monochromator output, set by color scan control 320, and the memory color-state. By color-scanning, that, is temporal variation, or scanning, of the wavelength of the incident radiation by adjustable filter or monochromator means, 530, in time simultaneity with electrical addressing, 310, of the memory-associated intensity-sensitive photo detector element 380, therefore, the information state of the memory element in array 100 is determined at bit readout 330.

As alternative to color-scanning, that is, without the monochromator 530, one can utilize a wavelength dependent photo detector array 300, in conjunction with the wide band light source 500, to constitute the light measuring means and accomplish the memory color-stale reading function. In this realization, each element of the color-state memory 100 transmits its own color light onto its associated photo detector element in the array 300. Since a wavelength dependent photo detector generates an electrical signal proportional to the color of the incident radiation, a unique measurement is generated indicative of the color state of the memory element.

Figure 3:
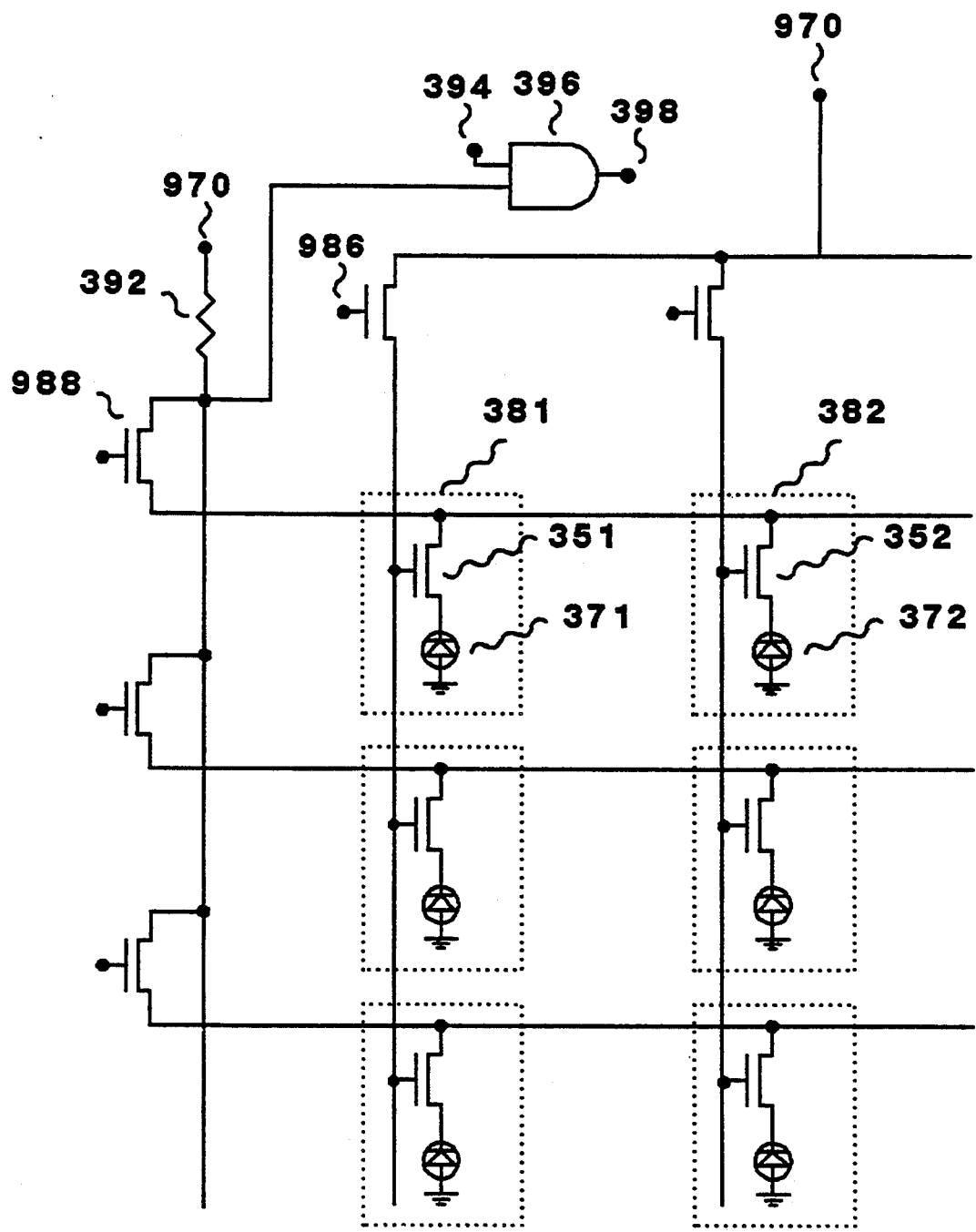
FIG. 3 is an electrical block diagram of the optical memory illustrating addressing and reading circuitry.

The electrical block diagram of the photo detector addressing and actuation circuitry is illustrated in FIG. 3. A classical row and column addressing matrix is utilized with row-control transistor 988 and column-control transistor 986 addressing the desired photo detector cell switch 351 of the array. The address decode circuitry, not shown, provides the gate signal to the appropriate column-line transistor 986 which in turn actuates all cell switches 351 in the column by connecting the supply voltage 970 to all of the cell switch gates, the switches shown here being field effect transistors. In addition, the address decode circuitry also provides a gate signal to the appropriate row-line transistor 988 which allows current flow through the cell switch 351 to the cell photo detector 371, the current being proportional to the light falling upon the photo detector thereby constituting an intensity-sensitive means. When the photo detector sector cell 381 is activated through cell switch 351, any light-generated current through photo diode 371 causes a voltage drop in resistor 392. This signal, in combination with a reference signal 394 at the input to digital comparator 396 generates an output 398 indicative of the light intensity at the photo diode 371. The detector array 300, of the light measuring means can be realized in photo diodes or several alternative technologies such as charge coupled devices (CCD's), or photo transistors. Two-dimensional light detector arrays are now being used as image sensors in many solid-state camera applications.

Figure 4:
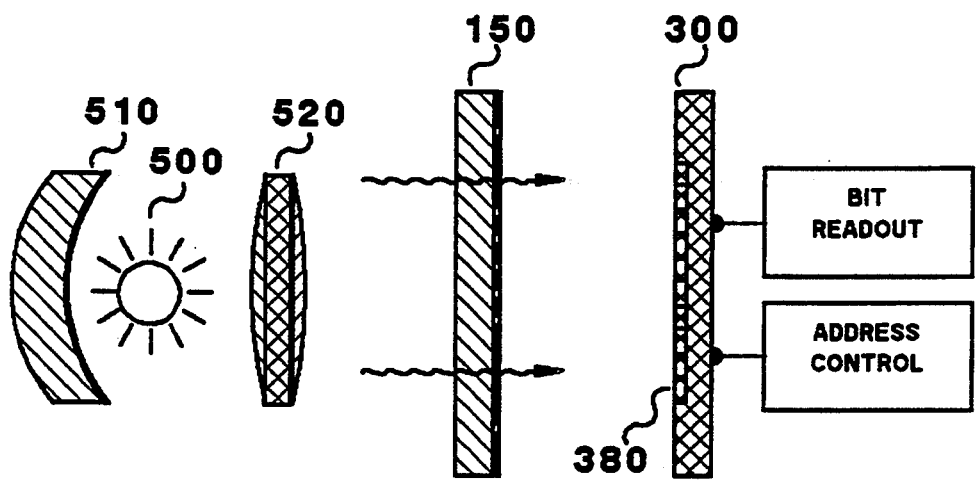
FIG. 4 is a schematic view showing another embodiment of the random access optical memory according to the present invention.

Displayed in FIG. 4 is a second rudimentary version of the random access optical digital memory system, illustrated without the color- or intensity-state features, which is equivalent to the degenerate two-dimensional system discussed above. The optical digital record 150 consists solely of two-dimensional spatial bit information, shown here of transmissive type. Random access in the memory reading function is again realized through individual electrical actuation of photo detector cells in array 300.

When the color-dimension attribute of the present invention is attached to the memory addressing facility, a third version of the system is manifest. The resulting random access optical digital memory system designs is shown in block diagram form in FIG. 5 and the physically position-matched or co-located elements constituted by tile optical digital record 150 consisting of a two-dimensional array of optical characteristic modification means such as holes, bumps or other localized variations, color address array 200 and random access photo detector array 300, are shown in enlarged sectional form, in FIG. 6. The color elements, 211–212, added to the spatial addressing function, permit a further expansion of the memory resolution when the physical surface area extension of the memory elements 151 and 152 and the color filter elements, 211 and 212, are smaller than the physical extent of the photo detector element 381. Under these circumstances, during memory reading by bit readout 330, memory addressing is firstly accomplished by address control 310, which activates photo detector 381, and is secondly accomplished through color control 340, which sets the light wavelength impinging on the memory elements 151–154 and filter elements 211–214, through monochromator control 530. If the selected memory element 151 through associated filter element 211, for example, is a hole, photo detector element 381 will record a light pulse. Additional wavelength selection at monochromator 530 can select an additional memory element, 152 for example, through color filter element 212, while still utilizing the one photo detector element 381 for light detection.

Figure 7:
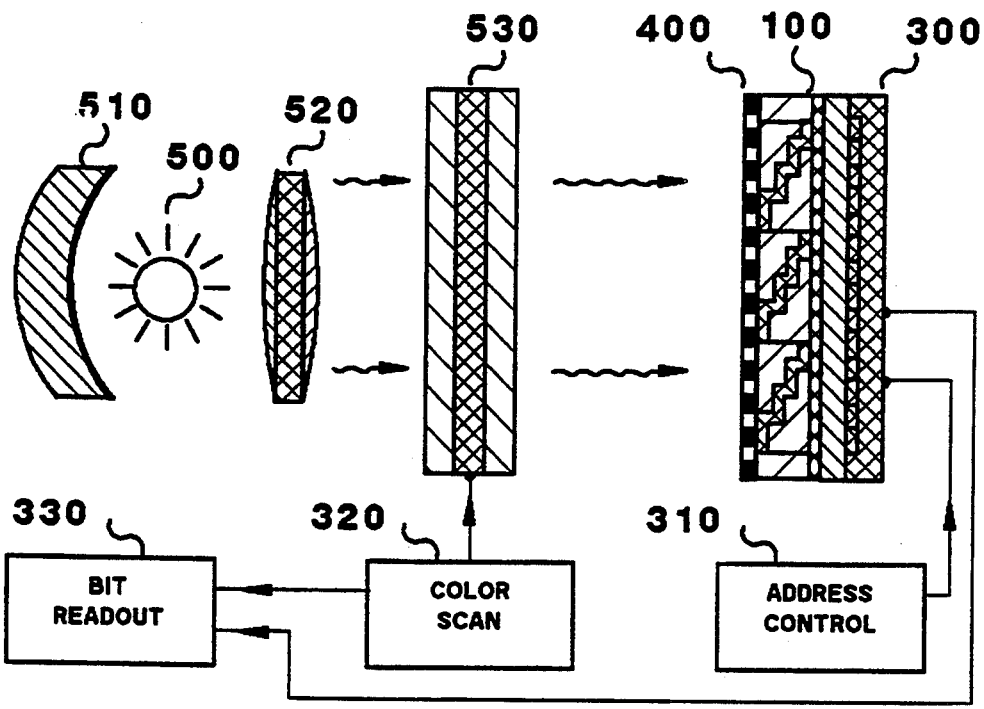
FIG. 7 is a schematic view of the color- and intensity-state optical memory in integral form.

A second preferred embodiment of the random-access optical digital memory system of FIG. 1 is displayed in FIG. 7. This second embodiment is accomplished by physically integrating the intensity-state array 400, color-state array 100 and photo detector array 300 into a single unit. Such integration is possible, for example, with modern day integrated circuit and thin-film processing technologies. If the reading function, in FIG. 7, residing in light source means 500, monochromator means 530 and light detector means 300, is realized as an entity separate from the optical digital record function, 100 and 400, partial integration in the form of physical consolidation of memory elements 100 and 400 is also possible, as was shown in FIG. 2.

Figure 5:
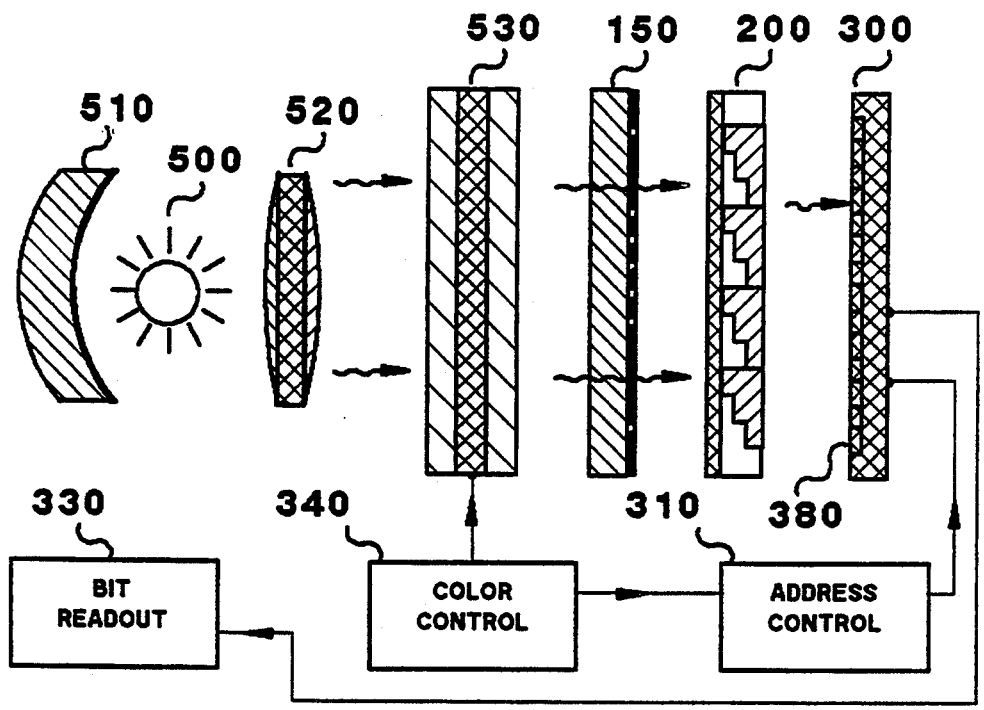
FIG. 5 is a schematic view of a color-addressed optical memory according to the present invention.
Figure 6:
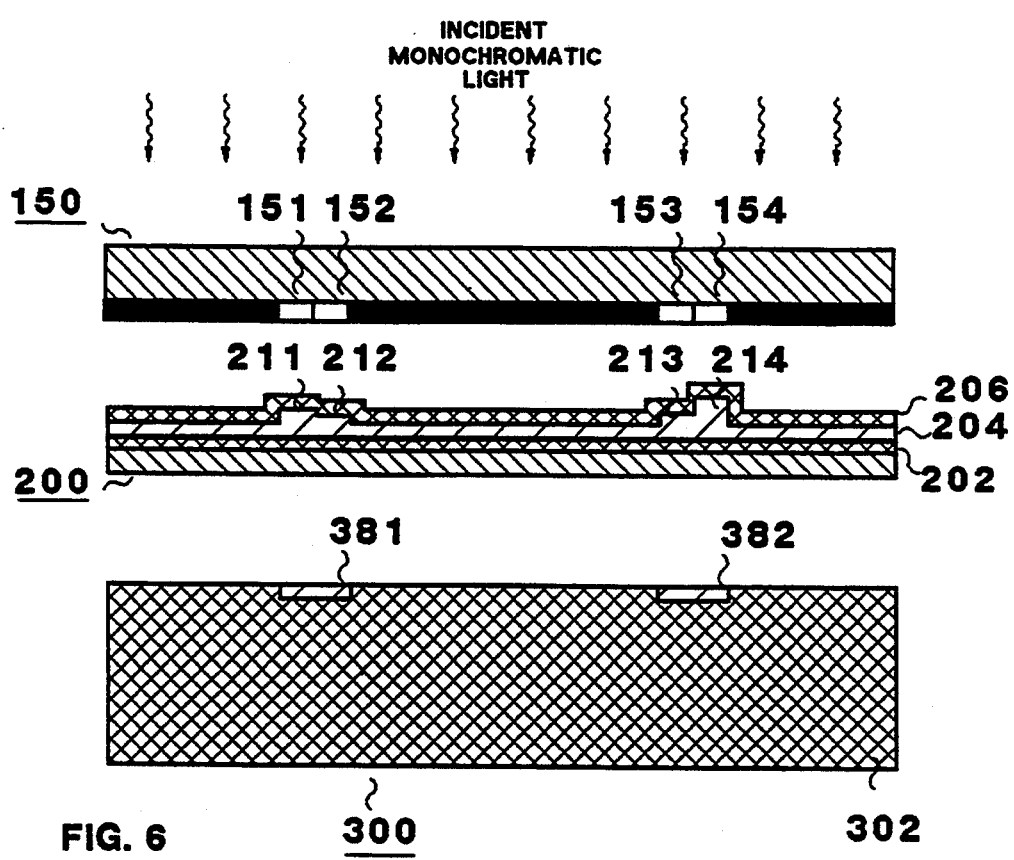
FIG. 6 is an enlarged sectional view of two cells of the color-addressed optical memory of FIG. 5.
Figure 8:
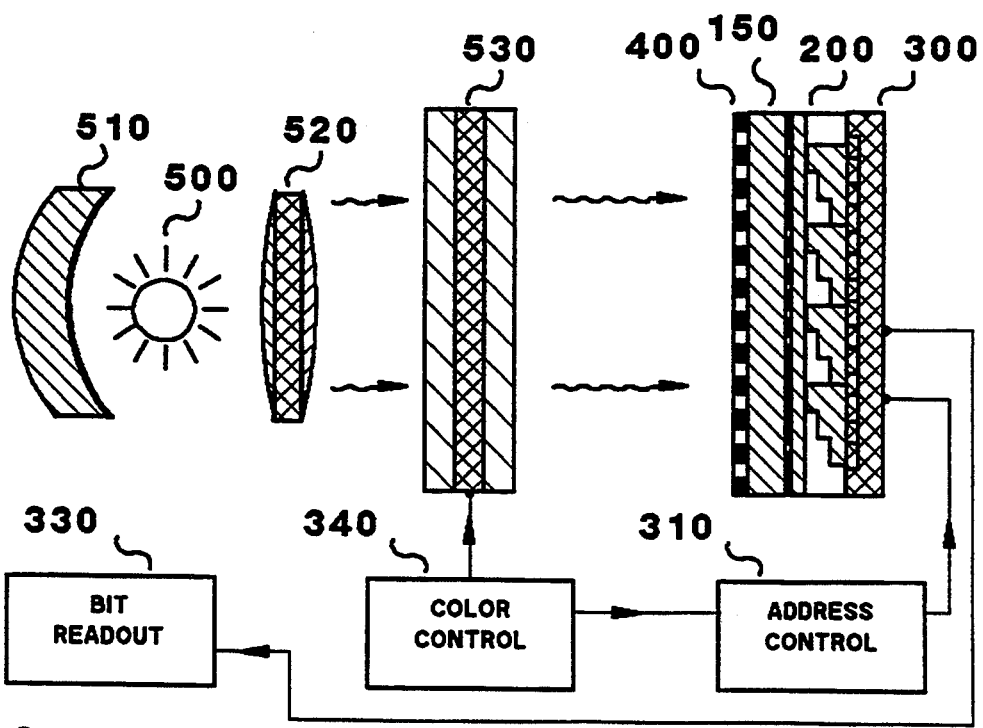
FIG. 8 is a schematic view of the color-addressed optical memory in integral form with intensity masking.

Similarly, FIG. 8 displays a comparably integrated version of the color-addressed memory of FIG. 5 wherein the optical digital record 150, color-address array 200, photo detector array 300 and an added intensity-state array 400 are incorporated into a single unit.

Figure 9:
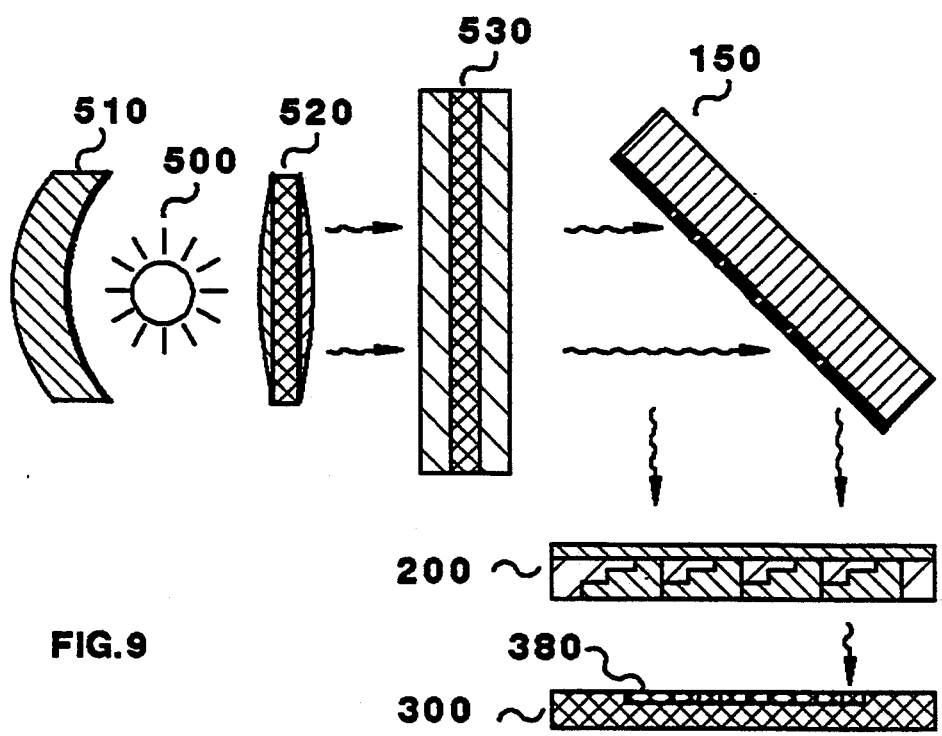
FIG. 9 is a schematic view showing a reflective version of the random access optical memory.

Reflective optical digital record elements 150(or 100) are readily incorporated, as shown for example in FIG. 9 for the color-addressed system.

The concepts thus far described rely on micro-miniature manufacturing techniques. In the embodiments illustrated in FIGS. 1–2 and 4–9, small scale micro structures achievable only with semiconductor integrated circuit processing technology and thin-film deposition technology are depicted. The ability to fabricate the memory bits, filters and detector arrays of this invention in semiconductor circuit technology makes possible the achievement of microscale cells and, therefore, a large number of elements for a high density memory system. Manufacturing steps, in which a Fabry-Perot etalon color-state memory array and an areally-graded intensity-state array are utilized, are illustrated in FIGS. 10–15.

Figure 10:
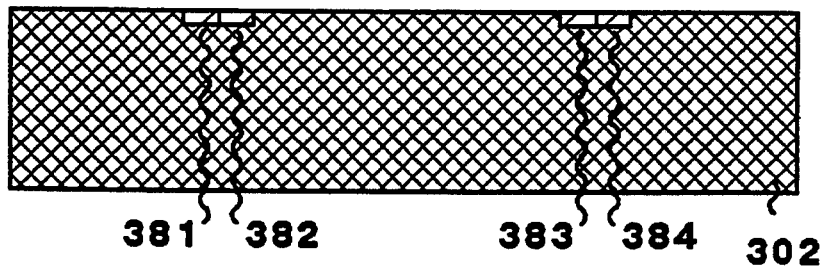
FIGS. 10, 11, 12, 13, 14, and 15 illustrate steps in the manufacture of the optical memory.

Electronic photo detector cells 381–384 are first fabricated in the silicon substrate 302 as shown in FIG. 10.

Figure 11:
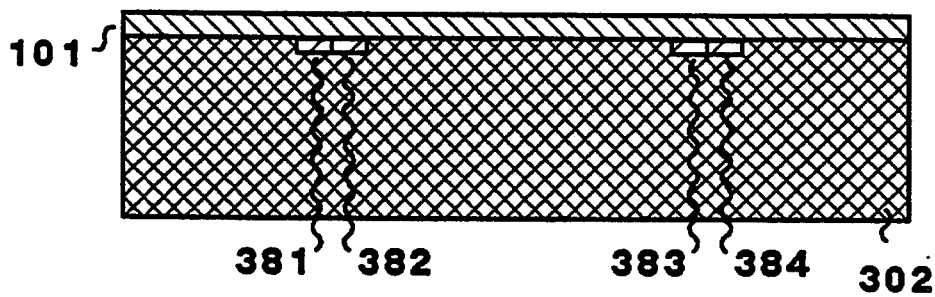

An optional light transmitting buffer layer 101 is then deposited on the top surface. This step is shown in FIG. 11.

Figure 12:
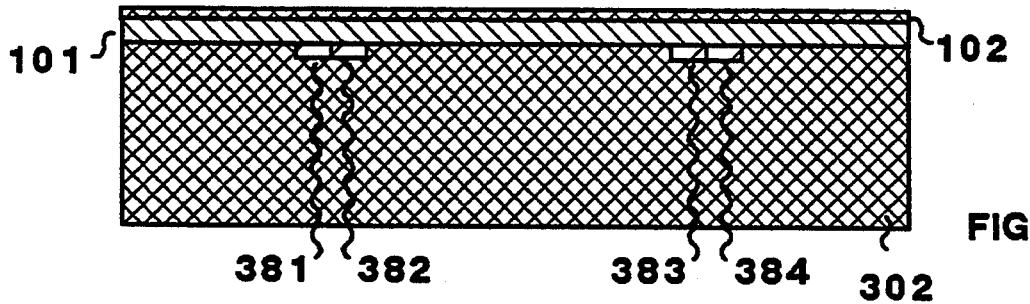

A first mirror layer 102, is then laid down over the entire wafer surface as illustrated in FIG. 12. Dielectric or metallic mirror materials can be used.

Figure 13:
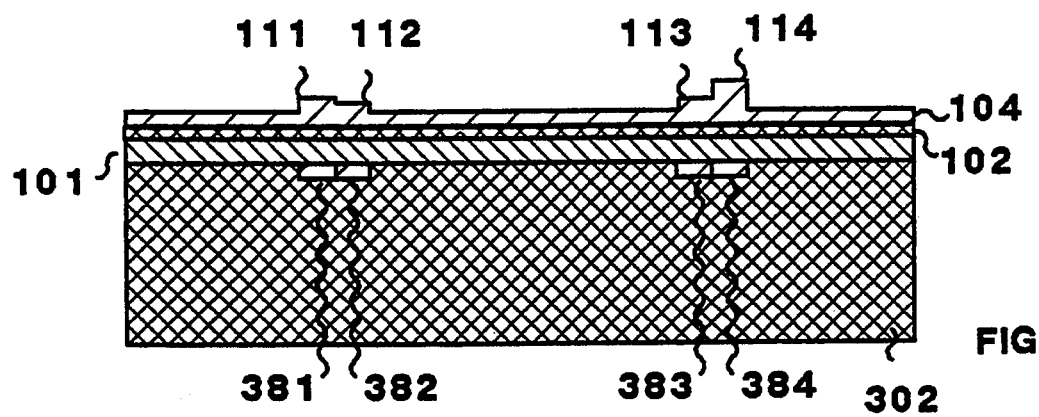

A series of glass, or other transparent layers, 104 are then put down, as in FIG. 13, thereby forming color-state memory elements 111–114. The thickness and patterning of these etalon layers is determined by the color state information desired at each memory site location.

Figure 14:
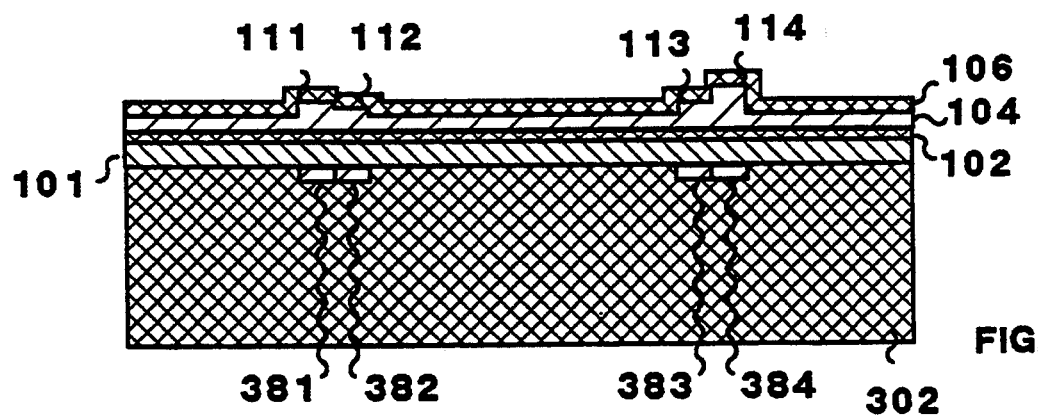

After these steps, a second mirror layer 106 is then deposited on the top surface as shown in FIG. 14 thereby completing the etalon and the color-state memory array.

Figure 15:
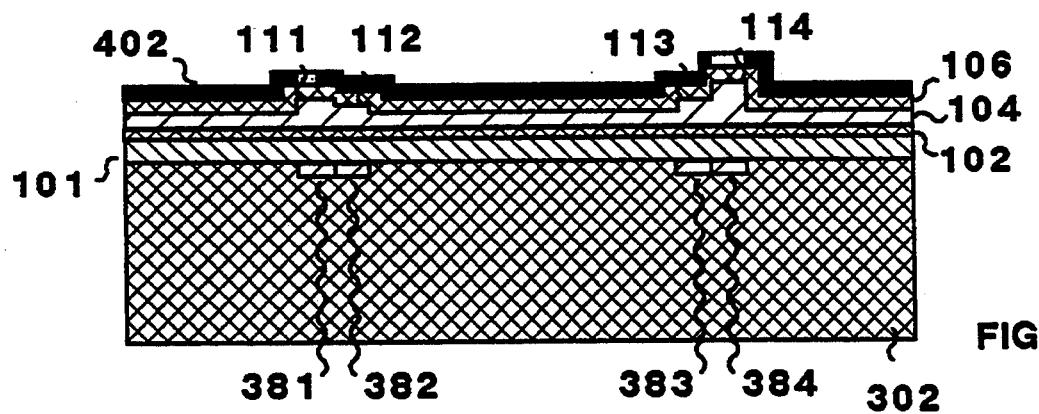

FIG. 15 illustrates the memory after the final deposition step, a process step which provides the apertures defining the light-intensity states at each memory site location.

I claim:

1. A four-dimensional optical digital record comprising:

a spatially two-dimensional array of color-state means; and a co-located spatially two-dimensional array of intensity-state means.

2. The optical digital record according to claim 1 wherein the color-state means is comprised of an array of color-graded dye-filters.

3. The optical digital record according to claim 1 wherein the color-state means is comprised of an array of color-graded Fabry-Perot etalons.

4. The optical digital record according to claim 1 wherein the intensity-state means is comprised of an array of areally-graded apertures.

5. The optical digital record according to claim 1 wherein the intensity-state means is comprised of an array of thickness-graded absorptive layers.

6. The optical digital record according to claim 1 wherein the intensity-state means is comprised of an array of density-graded absorptive layers.

7. The optical digital record according to claim 1 wherein the intensity-state means is comprised of a single-state means.

8. The optical digital record according to claim 1 wherein the color-state means is comprised of a single-state means.

9. A four-dimensional optical digital memory system comprising:
   a spatially two-dimensional array of color-state means;
   a co-located spatially two-dimensional array of intensity-state means;
   a light source means; and
   a wavelength-dependent intensity-sensitive light measuring means.

10. The optical digital memory system of claim 9 wherein the intensity-state means is comprised of a single-state means.

11. The optical digital memory system of claim 9 wherein the color-state means is comprised of a single-state means.

12. The optical digital memory system of claim 9 wherein tile light measuring means comprises:
    a scanning monochromator means; and
    a light detector means positioned to intercept light from the optical digital record.

13. The optical digital memory system of claim 9 wherein the light source means is comprised of a multiplicity of light emitting dimes with various spectral outputs.

14. The optical digital memory system of claim 9 wherein the light source means is comprised of a multiplicity of laser diodes with various spectral outputs.

15. The optical digital memory system of claim 9 wherein the light measuring means is comprised of a wavelength-dependent light detector means positioned to intercept light from the optical digital record.

16. The optical digital memory system of claim 15 wherein the wavelength-dependent light detector means is comprised of an array of photo diodes.

17. The optical digital memory system of claim 15 wherein the wavelength-dependent light detector means is comprised of an array of photo transistors.

* * * * *